(12) United States Patent
Huang

(10) Patent No.: US 12,218,127 B2
(45) Date of Patent: Feb. 4, 2025

(54) ELECTROSTATIC DISCHARGE CIRCUIT HAVING STABLE DISCHARGING MECHANISM

(71) Applicant: REALTEK SEMICONDUCTOR CORPORATION, Hsinchu (TW)

(72) Inventor: Chung-Yu Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 187 days.

(21) Appl. No.: 17/994,422

(22) Filed: Nov. 28, 2022

(65) Prior Publication Data
US 2023/0170347 A1 Jun. 1, 2023

(30) Foreign Application Priority Data
Nov. 30, 2021 (TW) ................................ 110144697

(51) Int. Cl.
*H02H 9/00* (2006.01)
*H01L 27/02* (2006.01)
*H02M 7/539* (2006.01)

(52) U.S. Cl.
CPC ........ *H01L 27/0266* (2013.01); *H02M 7/539* (2013.01)

(58) Field of Classification Search
CPC ... H01L 27/0266; H02M 7/539; H02H 9/045; H03K 17/08104

USPC ............................................ 361/56, 93.1, 111
See application file for complete search history.

(56) References Cited

U.S. PATENT DOCUMENTS

| | | | | |
|---|---|---|---|---|
| 2014/0368958 | A1* | 12/2014 | Ikimura ................. | H02H 9/046 361/56 |
| 2016/0087429 | A1* | 3/2016 | Wang ..................... | H02H 9/046 361/56 |
| 2021/0242677 | A1* | 8/2021 | Langguth ............... | H02H 9/046 |
| 2021/0343702 | A1* | 11/2021 | Xu ....................... | H01L 27/0288 |

* cited by examiner

*Primary Examiner* — Danny Nguyen
*Assistant Examiner* — Lucy M Thomas
(74) *Attorney, Agent, or Firm* — WPAT, PC

(57) ABSTRACT

The present invention discloses an electrical discharge circuit having stable discharging mechanism. A voltage-dividing circuit generates a detection signal such that a first inverter outputs an inverted detection signal. A first PMOS and a first NMOS are coupled through a first terminal between the voltage input terminal and a ground terminal. A second NMOS is coupled between a second terminal and the ground terminal. A first PMOS control terminal is coupled to the second terminal. A first and a second NMOS control terminals respectively receive the inverted detection signal and the detection signal. A resistor and a capacitor are coupled through the control terminal coupled to the second terminal and between the voltage input terminal and the ground terminal. A second inverter receives an inverted boosted detection signal from the control terminal to output a boosted detection signal to control an electrostatic discharge MOS to discharge the voltage input terminal.

9 Claims, 2 Drawing Sheets

ELECTROSTATIC DISCHARGE CIRCUIT HAVING STABLE DISCHARGING MECHANISM

BACKGROUND OF THE INVENTION

1. Field of the Invention

The present invention relates to an electrostatic discharge circuit having stable discharging mechanism.

2. Description of Related Art

Electrostatic discharge (ESD) causes permanent damage to electronic components and equipments and affects functions of integrated circuits such that the products are unable to work normally.

Electrostatic discharge may occur during manufacturing, packaging, testing, storage and transportation of the chips. In order to prevent the damage of the electrostatic discharge, the integrated circuit product can be equipped with an electrostatic discharge protection component or circuit and have a test performed thereon to enhance the protection of the integrated circuit from the electrostatic discharge and further increase the yield rate of the electronic products.

SUMMARY OF THE INVENTION

In consideration of the problem of the prior art, an object of the present invention is to supply an electrostatic discharge circuit having stable discharging mechanism.

The present invention discloses an electrostatic discharge circuit having discharging mechanism that includes a voltage-dividing circuit, a first inverter, a voltage boosting circuit, a first circuit, a second inverter and an electrostatic discharge (ESD) transistor. The voltage-dividing circuit is electrically coupled to a voltage input terminal that is configured to receive a power signal, so as to generate a detection signal at a voltage-dividing terminal. The first inverter is configured to receive and invert the detection signal to output an inverted detection signal. The voltage boosting circuit includes a first PMOS circuit, a first NMOS circuit and a second NMOS circuit. the first PMOS circuit and the first NMOS circuit are electrically coupled in series between the voltage input terminal and a ground terminal through a first terminal, wherein the first PMOS circuit includes a first PMOS control terminal electrically coupled to a second terminal and the first NMOS circuit includes a first NMOS control terminal configured to receive the inverted detection signal. The second NMOS circuit is electrically coupled between the second terminal and the ground terminal and includes a second NMOS control terminal configured to receive the detection signal. The first circuit includes a resistive circuit for providing resistance that is electrically coupled between the voltage input terminal and a control terminal and a capacitive circuit for providing capacitance that is electrically coupled between the control terminal and a ground terminal, wherein the control terminal is electrically coupled to the second terminal. the second inverter is electrically coupled between the voltage input terminal and the ground terminal and configured to receive and invert an inverted boosted detection signal from the control terminal to output a boosted detection signal. The electrostatic discharge transistor is electrically coupled between the voltage input terminal and the ground terminal and configured to be controlled by the boosted detection signal for performing discharging on the voltage input terminal when being controlled to be turned on by the boosted detection signal.

These and other objectives of the present invention will no doubt become obvious to those of ordinary skill in the art behind reading the following detailed description of the preferred embodiments that are illustrated in the various figures and drawings.

DETAILED DESCRIPTION OF THE PREFERRED EMBODIMENTS

An aspect of the present invention is to provide an electrostatic discharge circuit having stable discharging mechanism to directly detect a voltage variation by disposing a voltage-dividing circuit to accomplish quick response mechanism and maintain a discharging time that is long enough such that the discharging operation of the electrostatic discharge transistor becomes stable. Further, a RC circuit is disposed to keep the operation of the electrostatic discharge transistor even more stable.

Figure 1:
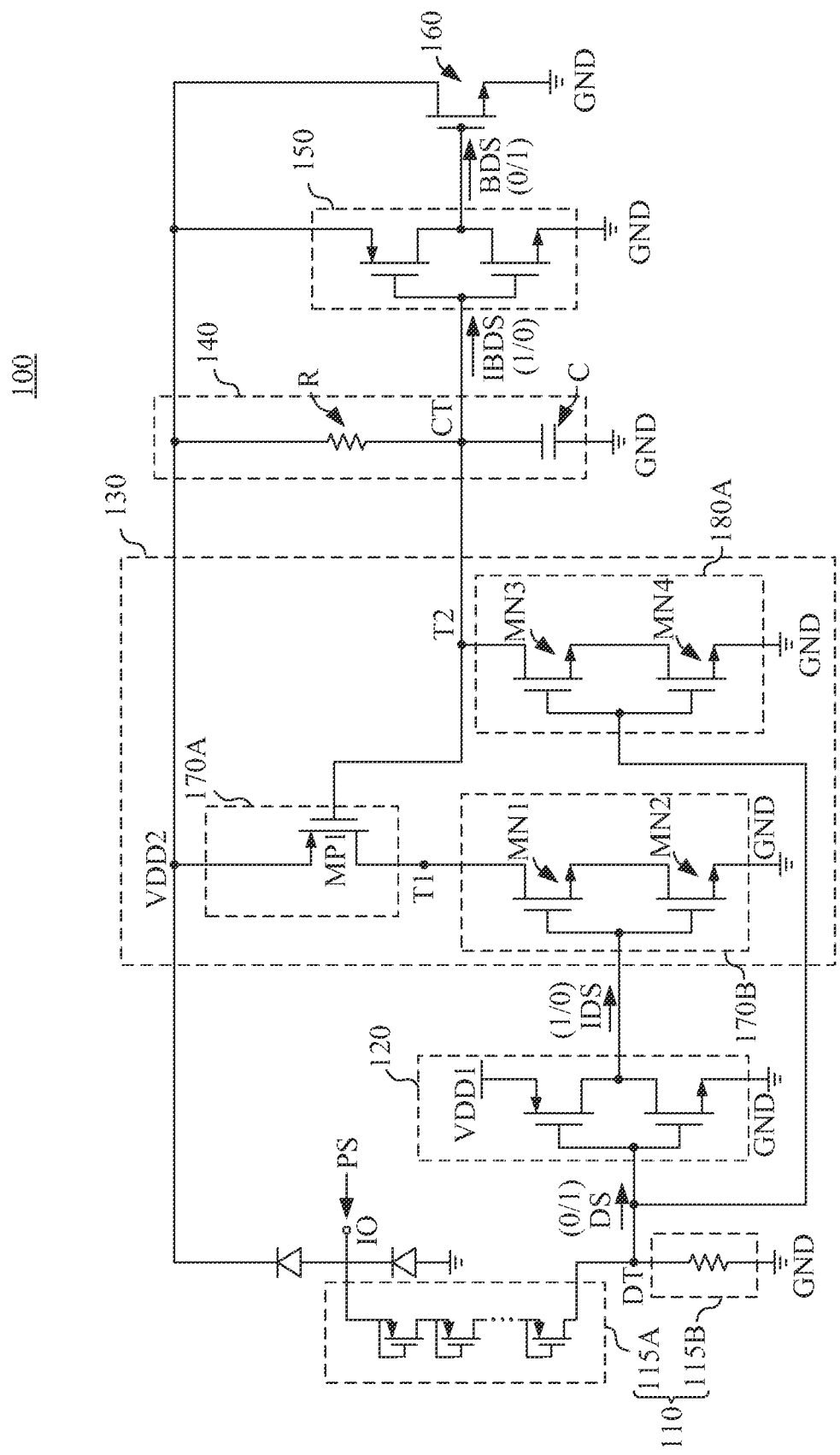
FIG. 1 illustrates a circuit diagram of an electrostatic discharge circuit having stable discharging mechanism according to an embodiment of the present invention.

Reference is now made to FIG. 1. FIG. 1 illustrates a circuit diagram of an electrostatic discharge circuit 100 having stable discharging mechanism according to an embodiment of the present invention. The electrostatic discharge circuit 100 includes a voltage-dividing circuit 110, a first inverter 120, a voltage boosting circuit 130, a RC circuit 140, a second inverter 150 and an electrostatic discharge (ESD) transistor 160.

The voltage-dividing circuit 110 is electrically coupled to a voltage input terminal IO configured to receive a power signal PS to generate a detection signal DS at a voltage-dividing terminal DT.

In an embodiment, the voltage-dividing circuit 110 includes a first resistive circuit 115A and a second resistive circuit 115B electrically coupled between the voltage input terminal IO and a ground terminal GND through the voltage-dividing terminal DT.

The first resistive circuit 115A includes a resistor, a diode, a diode-connected transistor or a combination thereof. The number of the elements described above can be one or more than one. When the number is more than one, these elements can be coupled in series. In FIG. 1, the first resistive circuit 115A is exemplarily illustrated as a plurality of diode-connected P-type transistors and the second resistive circuit 115B is exemplarily illustrated as a resistor. In other embodiments, other elements described above, a diode-connected N-type transistor or any combination of the elements described above can be used to implement the first resistive circuit 115A and the second resistive circuit 115B. The present invention is not limited thereto.

In an embodiment, the electrostatic discharge circuit 100 can be disposed in an electronic apparatus (not illustrated in the figure) and receives the power signal PS through the voltage input terminal IO during the operation of the electronic apparatus. The detection signal DS can be further generated at the voltage-dividing terminal DT according to a resistance ratio between the first resistive circuit 115A and the second resistive circuit 115B.

The first inverter 120 operates according to a first voltage VDD1. The voltage boosting circuit 130, the second inverter 150 and the electrostatic discharge transistor 160 operates according to a second voltage VDD2. The first voltage VDD1 is smaller than the second voltage VDD2. In an embodiment, the first voltage VDD1 is such as, but not limited to 0.9, 1.2 or 1.8 volts. The second voltage VDD2 is such as, but not limited to 3.3 volts.

In the present embodiment, the second voltage VDD2 is generated according to the power signal PS. More specifically, in an embodiment, the voltage boosting circuit 130, the second inverter 150 and the electrostatic discharge transistor 160 are electrically coupled to the voltage input terminal IO to receive the power signal PS. Other circuit elements can be disposed between each of the elements described above and the voltage input terminal IO under the condition that the function of the electrostatic discharge circuit 110 is not affected.

In different embodiments, the first voltage VDD1 can be selectively generated by another independent power signal (not illustrated in the figure) or according to a voltage divided from the power signal PS.

As a result, the internal elements of first inverter 120 (e.g., transistors) have a relatively lower threshold voltage. The internal elements of first inverter 120 (e.g., transistors) of the voltage boosting circuit 130, the second inverter 150 and the electrostatic discharge transistor 160 have a relatively higher threshold voltage. The first inverter 120 has a response speed quicker than that of the voltage boosting circuit 130, the second inverter 150 and the electrostatic discharge transistor 160.

The first inverter 120 is configured to receive and invert the detection signal DS to output an inverted detection signal IDS.

The voltage boosting circuit 130 is configured to generate an inverted boosted detection signal IBDS according to the detection signal DS and the inverted detection signal IDS. In an embodiment, the voltage boosting circuit 130 includes a first PMOS circuit 170A, a first NMOS circuit 170B and a second NMOS circuit 180A.

In the embodiment in FIG. 1, the first PMOS circuit 170A includes a P-type transistor MP1. The first NMOS circuit 170B includes a first N-type transistor MN1 and a second N-type transistor MN2 electrically coupled in series. The second NMOS circuit 180A includes a first N-type transistor MN3 and a second N-type transistor MN4 electrically coupled in series.

The first PMOS circuit 170A and the first NMOS circuit 170B are electrically coupled between the voltage input terminal IO and the ground terminal GND in series through the first terminal T1. The first PMOS circuit 170A includes a first PMOS control terminal electrically coupled to the second terminal T2. The first NMOS circuit 170B includes a first NMOS control terminal configured to receive the inverted detection signal IDS.

More specifically, in the embodiment in FIG. 1, a source of the P-type transistor MP1 is electrically coupled to the voltage input terminal IO, a drain of the P-type transistor MP1 is electrically coupled to first terminal T1 and a gate of the P-type transistor MP1 serves as a first PMOS control terminal electrically coupled to the second terminal T2. A drain of the first N-type transistor MN1 is electrically coupled to the first terminal T1, a source of the first N-type transistor MN1 is electrically coupled to a drain of the second N-type transistor MN2. The drain of the second N-type transistor MN2 is electrically coupled to the source of the first N-type transistor MN1, a source of the second N-type transistor MN2 is electrically coupled to the ground terminal GND. Gates of the first N-type transistor MN1 and the second N-type transistor MN2 are electrically coupled to each other and serve as a first NMOS control terminal to receive the inverted detection signal IDS.

The second NMOS circuit 180A is electrically coupled between the second terminal T2 and the ground terminal GND and includes a second NMOS control terminal configured to receive the detection signal DS.

More specifically, in the embodiment in FIG. 1, a drain of the N-type transistor MN3 is electrically coupled to the second terminal T2. A source of the N-type transistor MN3 is electrically coupled to a drain of the N-type transistor MN4. The drain of the N-type transistor MN4 is electrically coupled to the source of the N-type transistor MN3. The source of the N-type transistor MN4 is electrically coupled to the ground terminal GND. Gates of the N-type transistor MN3 and the N-type transistor MN4 are electrically coupled to each other and serve as the second NMOS control terminal to receive the detection signal DS.

In an embodiment, each of the first N-type transistor MN1 and the first N-type transistor MN3 is an I/O device that has a relatively higher voltage-withstanding ability (e.g., 3.3 volts). Each of the second N-type transistor MN2 and the second N-type transistor MN4 is a core device that has a relatively lower voltage-withstanding ability (e.g., 0.9, 1.2 or 1.8 volts). By using such a disposition, the first NMOS circuit 170B and the second NMOS circuit 180A can have a better reliability.

In an embodiment, the first NMOS circuit 170B may selectively include an N-type transistor (not illustrated in the figure) disposed to be electrically coupled to the first N-type transistor MN1 and the second N-type transistor MN2 in series and controlled by another control signal. Such an additional N-type transistor is turned on according to the enabling of the corresponding control signal after the sources of the first voltage VDD1 and the second voltage VDD2 are already powered when the sources are different. Unknown signal state in the first NMOS circuit 170B caused due to the different powered timings of the different sources of the first voltage VDD1 and the second voltage VDD2 can be avoided. Identically, the second NMOS circuit 180A may include the same element. The detail is not described herein.

The RC circuit 140 includes a resistor R electrically coupled between the voltage input terminal IO and a control terminal CT, and a capacitor C electrically coupled between the control terminal CT and the ground terminal GND. The control terminal TC is electrically coupled to the second terminal T2.

The second inverter 150 is electrically coupled between the voltage input terminal IO and the ground terminal GND, and is configured to receive and invert the inverted boosted detection signal IBDS from control terminal TC to output a boosted detection signal BDS.

The electrostatic discharge transistor 160 is electrically coupled between the voltage input terminal IO and the ground terminal GND and is configured to be controlled by the boosted detection signal BDS. The electrostatic discharge transistor 160 performs discharging on the voltage input terminal IO when being controlled to be turned on by the boosted detection signal BDS. In the present embodiment, the electrostatic discharge transistor 160 is a N-type transistor. In other embodiments, an additional inverter can be disposed between the electrostatic discharge transistor 150 and the second inverter 140 such that the electrostatic discharge transistor 150 is implemented by a P-type transistor. The present invention is not limited thereto.

The operation of the electrostatic discharge circuit 100 that includes an ordinary operation mode and a discharging mode according to different voltage amounts of the voltage input terminal IO is described in the following paragraphs. In FIG. 1, according to the logic level of the voltages, each of the circuit nodes is labeled by either a "1" as a high state level or a "0" as a low state level under the ordinary operation mode and the discharging mode.

When the voltage amount at the voltage input terminal IO does not exceed a predetermined level, e.g., only the power signal PS is received and an electrostatic input ES generated by such as actual electrostatic charges or an electrical over shoot (EOS) is not received, the electrostatic discharge circuit 100 operates in the ordinary operation mode. Under such a condition, the detection signal DS generated by the voltage-dividing circuit 110 at the voltage-dividing terminal DT is at the low state level (0). The inverted detection signal IDS is at the high state level (1) due to the operation of the first inverter 120.

According to the inverted detection signal IDS at the high state level and the detection signal DS at the low state level, the first NMOS circuit 170B is turned on, and the first PMOS circuit 170A and the second NMOS circuit 180A are turned off.

More specifically, the first N-type transistor MN1 and the second N-type transistor MN2 in the first NMOS circuit 170B are turned on due to the inverted detection signal IDS at the high state level to drain current from the first terminal T1 such that the voltage of the first terminal T1 drops to the low state level (0). The first N-type transistor MN3 and the second N-type transistor MN4 in the second NMOS circuit 180A are turned off due to the detection signal DS at the low state level.

The capacitor C in the RC circuit 140 receives the charging current from the voltage input terminal IO through the resistor R such that the voltage at the control terminal CT rises to the high state level (1). Since the second NMOS circuit 180A is turned off, the control terminal CT is not discharged through the second terminal T2. As a result, the voltage at the second terminal T2 rise to the high state level (1) together with the control terminal CT such that the P-type transistor MP1 in the first PMOS circuit 170A is turned off.

The inverted boosted detection signal IBDS generated by the control terminal CT is therefore at the high state level (1). The boosted detection signal BDS is at the low state level (0) due to the operation of the second inverter 150 such that the electrostatic discharge transistor 160 is turned off.

On the other hand, when the voltage at the voltage input terminal IO exceeds the predetermined level, e.g., the power signal PS is received and the electrostatic input ES having an instant large voltage is also received, the electrostatic discharge circuit 100 operates in the discharging mode. Under such a condition, the detection signal DS generated by the voltage-dividing circuit 110 at the voltage-dividing terminal DT is at the high state level (1). The inverted detection signal IDS is at the low state level (0) due to the operation of the first inverter 120.

According to the inverted detection signal IDS at the low state level and the detection signal DS at the high state level, the first NMOS circuit 170B is turned off, and the first PMOS circuit 170A and the second NMOS circuit 180A are turned on.

More specifically, the first N-type transistor MN3 and the second N-type transistor MN4 in the second NMOS circuit 180A are turned on due to the detection signal DS at the high state level to drain current from the second terminal T2 such that the voltage at the second terminal T2 drops to the low state level (0). The P-type transistor MP1 in the first PMOS circuit 170A is turned on accordingly. The first N-type transistor MN1 and the second N-type transistor MN2 in the first NMOS circuit 170B are turned off, due to the inverted detection signal IDS at the low state level such that the first terminal T1 receives the current from the P-type transistor MP1 to rise the voltage at the first terminal T1 to the high state level (1).

The capacitor C in the RC circuit 140 is discharged through the control terminal CT and the second terminal T2 since the second NMOS circuit 180A is turned on such that the voltage at the control terminal CT drops to the low state level (0).

The inverted boosted detection signal IBDS generated by the second terminal T2 is therefore at the low state level (0). The boosted detection signal BDS is at the high state level (1) due to the operation of the second inverter 150 such that the electrostatic discharge transistor 160 is turned on to discharge the voltage input terminal IO.

In the operation described above, the time constant (the product of the resistance of the resistor R and the capacitance of the capacitor C) of the RC circuit 140 determines a high frequency response time of the electrostatic discharge circuit 100 at a high frequency range that is larger than a predetermined frequency, and the voltage-dividing circuit 110 and the first inverter 120 determine a low frequency response time of the electrostatic discharge circuit 100 at a low frequency range that is lower than the predetermined frequency.

It is appreciated that after the electrostatic discharge transistor 150 discharges the voltage input terminal IO for a certain time period such that the voltage at the voltage input terminal IO drops to make the voltage of the detection signal DS divided from the voltage at the voltage input terminal IO return to the low state level (0), the electrostatic discharge circuit 110 returns to the ordinary operation mode as well.

In some approaches, the electrostatic discharge circuit uses a RC circuit to be coupled to an electrostatic input terminal to further control an inverter to determine whether a discharge transistor is turned on. The disposition of the RC circuit determines whether the discharge transistor is turned on according to the frequency of the electrostatic input. When the duration of the electrostatic input is not long enough or when the energy of the electrostatic input is not large enough, the inverter responses slowly due to the RC circuit to be charges. Not only the time that the discharge transistor is turned on is late, but also the duration of the discharging mechanism performed by the discharge transistor cannot be kept long enough. Further, under such a condition, the discharge transistor operates according to a breakdown mechanism such that the discharge transistor is turned on unevenly.

As a result, the electrostatic discharge circuit of the present invention directly detects a voltage variation by disposing a voltage-dividing circuit to accomplish quick response mechanism and maintains a discharging time that is long enough such that the discharging operation of the electrostatic discharge transistor becomes stable. Further, a RC circuit is disposed to keep the operation of the electrostatic discharge transistor even more stable.

It is appreciated that the number of the transistors included in each of the first PMOS circuit 170A, the first NMOS circuit 170B and the second NMOS circuit 180A is merely an example In other embodiments, the number of the transistors included in each of the circuits described above may be different based on practical requirements. The present invention is not limited thereto.

Figure 2:
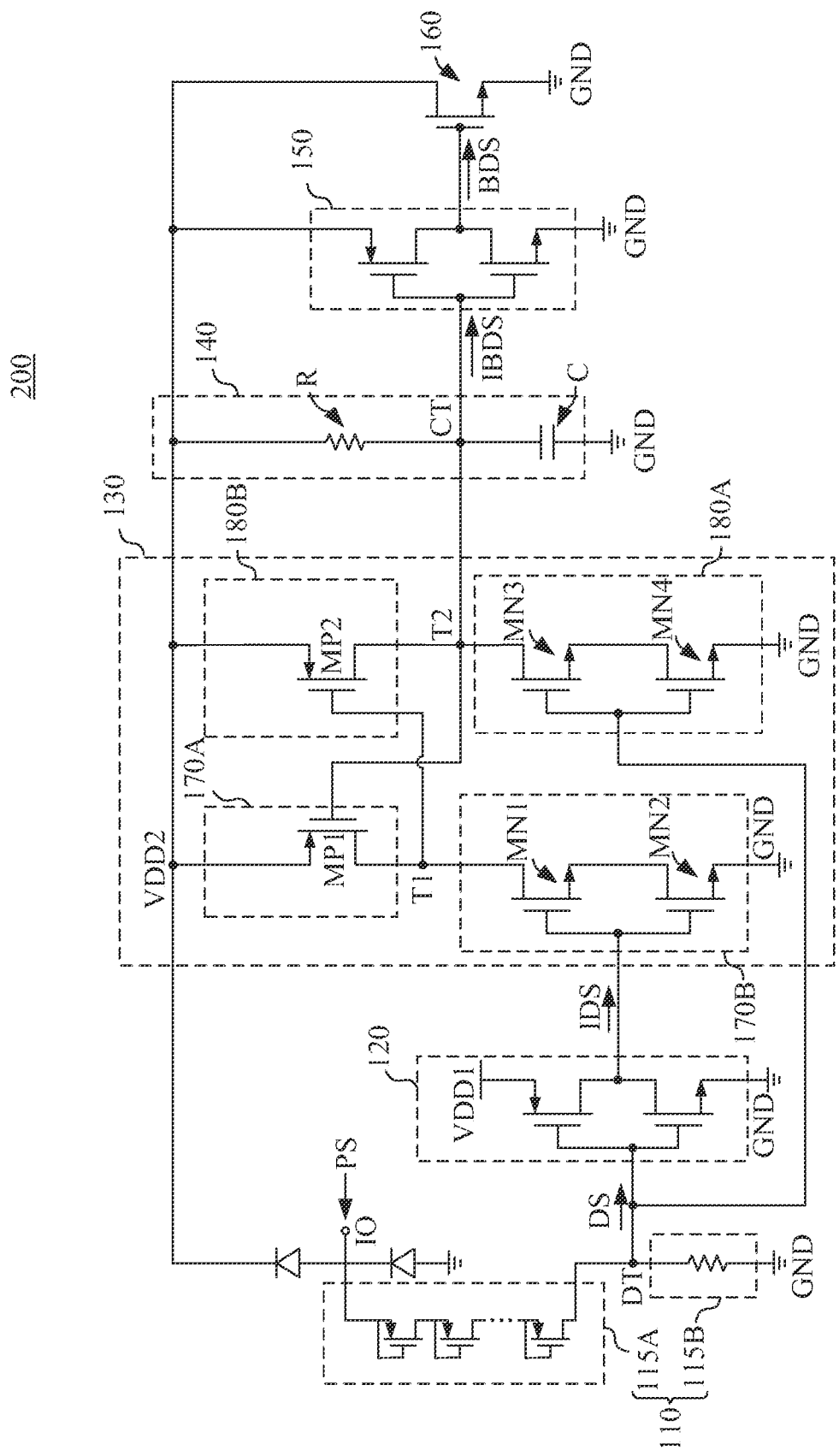
FIG. 2 illustrates a circuit diagram of an electrostatic discharge circuit having stable discharging mechanism according to another embodiment of the present invention.

Reference is now made to FIG. 2. FIG. 2 illustrates a circuit diagram of an electrostatic discharge circuit 200 having stable discharging mechanism according to an embodiment of the present invention.

Similar to the electrostatic discharge circuit 100 in FIG. 1, the electrostatic discharge circuit 200 in FIG. 2 includes the voltage-dividing circuit 110, the first inverter 120, the voltage boosting circuit 130, the second inverter 150 and the electrostatic discharge transistor 160. Further, the voltage boosting circuit 130 also includes the first PMOS circuit 170A, the first NMOS circuit 170B and the second NMOS circuit 180A. The elements having identical configurations and operations are not described herein.

In the present embodiment, the electrostatic discharge circuit 100 further includes a second P-type transistor circuit 180B. The second P-type transistor circuit 180B includes a P-type transistor MP2 electrically coupled between the voltage input terminal IO and second terminal T2, electrically coupled to the second NMOS circuit 180A in series and having a second P-type transistor control terminal electrically coupled to the first terminal T1.

When the electrostatic discharge circuit 100 operates in the ordinary operation mode, the P-type transistor MP2 in the second P-type transistor circuit 170A is turned on since the voltage at the first terminal T1 is at the low state level (0) such that the second terminal T2 receives a current to enhance the rising of the voltage at the second terminal T2 to the high state level (1). On the contrary, when the electrostatic discharge circuit 100 operates in the discharging mode, the P-type transistor MP2 in the second P-type transistor circuit 170A is turned off since the voltage at the first terminal T1 is at the high state level (1) such that voltage at the second terminal T2 drops to the low state level (0) due to the current-draining of the second NMOS circuit 180A.

It is appreciated that the number of the transistors included in the second P-type transistor circuit 180B is merely an example. In other embodiments, the number of the transistors included in the second P-type transistor circuit 180B may be different based on practical requirements. The present invention is not limited thereto.

It is appreciated that the embodiments described above are merely an example In other embodiments, it should be appreciated that many modifications and changes may be made by those of ordinary skill in the art without departing, from the spirit of the disclosure.

In summary, the present invention discloses the electrostatic discharge circuit having stable discharging mechanism that directly detects a voltage variation by disposing a voltage-dividing circuit to accomplish quick response mechanism and maintain a discharging time that is long enough such that the discharging operation of the electrostatic discharge transistor becomes stable. Further, a RC circuit is disposed to keep the operation of the electrostatic discharge transistor even more stable.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A circuit for discharging electrostatic, comprising:
a voltage-dividing circuit electrically coupled to a voltage input terminal that is configured to receive a power signal, so as to generate a detection signal at a voltage-dividing terminal;
a first inverter configured to receive and invert the detection signal to output an inverted detection signal;
a voltage boosting circuit comprising:
  a first PMOS circuit and a first NMOS circuit electrically coupled in series between the voltage input terminal and a ground terminal through a first terminal, wherein the first PMOS circuit comprises a first PMOS control terminal electrically coupled to a second terminal and the first NMOS circuit comprises a first NMOS control terminal configured to receive the inverted detection signal; and
  a second NMOS circuit electrically coupled between the second terminal and the ground terminal and comprising a second NMOS control terminal configured to receive the detection signal;
a first circuit comprising a resistive circuit for providing resistance that is electrically coupled between the voltage input terminal and a control terminal and a capacitive circuit for providing capacitance that is electrically coupled between the control terminal and a ground terminal, wherein the control terminal is electrically coupled to the second terminal;
a second inverter electrically coupled between the voltage input terminal and the ground terminal and configured to receive and invert an inverted boosted detection signal from the control terminal to output a boosted detection signal; and
an electrostatic discharge (ESD) transistor electrically coupled between the voltage input terminal and the ground terminal and configured to be controlled by the boosted detection signal for performing discharging on the voltage input terminal when being controlled to be turned on by the boosted detection signal;
wherein under an ordinary operation mode that a voltage at the voltage input terminal does not exceed a predetermined level, the detection signal is at a low state level, the inverted detection signal is at a high state level, the first NMOS circuit is turned on and the first PMOS circuit and the second NMOS circuit are turned off, the inverted boosted detection signal is at the high state level and the boosted detection signal is at the low state level such that the electrostatic discharge transistor is turned off; and
wherein under a discharging mode that a voltage at the voltage input terminal exceeds a predetermined level due to a reception of an electrostatic input, the detection signal is at a high state level, the inverted detection signal is at a low state level, the first NMOS circuit is turned off and the first PMOS circuit and the second NMOS circuit are turned on, the inverted boosted detection signal is at the low state level and the boosted detection signal is at the high state level such that the electrostatic discharge transistor is turned on.

2. The circuit of claim 1, wherein the first inverter operates according to a first voltage and the voltage boosting circuit, the second inverter and the electrostatic discharge transistor operate according to a second voltage generated according to the power signal, wherein the first voltage is smaller than the second voltage, the first voltage being 0.9, 1.2 or 1.8 volts and the second voltage being 3.3 volts.

3. The circuit of claim 2, wherein the second voltage is generated according to the power signal and the first voltage is generated according to another independent voltage source.

4. The circuit of claim 2, wherein the second voltage is generated according to the power signal and the first voltage is generated by a divided power signal divided from the power signal.

5. The circuit of claim 1, wherein the voltage-dividing circuit comprises a first resistive circuit and a second resistive circuit electrically coupled in series between the voltage input terminal and the ground terminal through the voltage-dividing terminal, wherein each of the first resistive circuit and the second resistive circuit comprises a resistor, a diode, a diode-connected transistor or a combination thereof.

6. The circuit of claim 1, wherein each of the first NMOS circuit and the second NMOS circuit comprises a first N-type transistor and a second N-type transistor electrically coupled in series, wherein the first N-type transistor is an I/O device and the second N-type transistor is a core device.

7. The circuit of claim 1, further comprising a second P-type transistor circuit electrically coupled between the voltage input terminal and the second terminal and so as to be electrically coupled to the second NMOS circuit in series, and the second P-type transistor circuit comprises a second P-type transistor control terminal electrically coupled to the first terminal.

8. The circuit of claim 1, wherein a time constant of the first circuit determines a high frequency response time of the circuit, the voltage-dividing circuit and the first inverter determines a low frequency response time of the circuit.

9. The circuit of claim 1, wherein the first circuit is a RC circuit, the resistive circuit comprises a resistor and the capacitive circuit comprises a capacitor.

* * * * *